(12) United States Patent
Seyedzadehdelcheh et al.

(10) Patent No.: US 12,066,965 B2
(45) Date of Patent: Aug. 20, 2024

(54) ENCODING OF SYMBOLS FOR A COMPUTER INTERCONNECT BASED ON FREQUENCY OF SYMBOL VALUES

(71) Applicant: ADVANCED MICRO DEVICES, INC., Santa Clara, CA (US)

(72) Inventors: SeyedMohammad Seyedzadehdelcheh, Bellevue, WA (US); Steven Raasch, Austin, TX (US); Sergey Blagodurov, Bellevue, WA (US)

(73) Assignee: Advanced Micro Devices, Inc., Santa Clara, CA (US)

(*) Notice: Subject to any disclaimer, the term of this patent is extended or adjusted under 35 U.S.C. 154(b) by 0 days.

(21) Appl. No.: 16/863,149

(22) Filed: Apr. 30, 2020

(65) Prior Publication Data
US 2021/0342285 A1  Nov. 4, 2021

(51) Int. Cl.
G06F 13/40 (2006.01)
G06F 13/42 (2006.01)
H03M 7/30 (2006.01)
H03M 9/00 (2006.01)

(52) U.S. Cl.
CPC ...... *G06F 13/4027* (2013.01); *G06F 13/4282* (2013.01); *H03M 7/30* (2013.01); *H03M 9/00* (2013.01)

(58) Field of Classification Search
None
See application file for complete search history.

(56) References Cited

U.S. PATENT DOCUMENTS

| | | | | |
|---|---|---|---|---|
| 5,124,987 A | * | 6/1992 | Milligan | G06F 3/0601 714/6.32 |
| 5,754,436 A | * | 5/1998 | Walsh | G06F 1/3203 700/286 |
| 5,978,951 A | * | 11/1999 | Lawler | H04L 49/309 370/392 |
| 6,978,410 B1 | * | 12/2005 | Parnas | G01R 31/3183 714/724 |
| 7,003,605 B2 | * | 2/2006 | Craft | G06F 13/4072 710/65 |

(Continued)

OTHER PUBLICATIONS

Intel, "AN 835: PAM4 Signaling Fundamentals", Mar. 12, 2019, https://www.intel.com/content/dam/www/programmable/us/en/pdfs/literature/an/an835.pdf, Accessed Jan. 30, 2020, 52 pages.

(Continued)

*Primary Examiner* — Henry Tsai
*Assistant Examiner* — Christopher A Bartels (57) ABSTRACT

Data are serially communicated over an interconnect between an encoder and a decoder. The encoder includes a first training unit to count a frequency of symbol values in symbol blocks of a set of N number of symbol blocks in an epoch. A circular shift unit of the encoder stores a set of most-recently-used (MRU) amplitude values. An XOR unit is coupled to the first training unit and the first circular shift unit as inputs and to the interconnect as output. A transmitter is coupled to the encoder XOR unit and the interconnect and thereby contemporaneously sends symbols and trains on the symbols. In a system, a device includes a receiver and decoder that receive, from the encoder, symbols over the interconnect. The decoder includes its own training unit for decoding the transmitted symbols.

20 Claims, 4 Drawing Sheets

(56) References Cited

U.S. PATENT DOCUMENTS

| | | | | |
|---|---|---|---|---|
| 7,248,696 | B2* | 7/2007 | Craft | H04L 9/0662 |
| | | | | 380/263 |
| 7,326,972 | B2* | 2/2008 | Ghoneima | G06F 13/4217 |
| | | | | 326/68 |
| 7,400,276 | B1* | 7/2008 | Sotiriadis | H03M 5/14 |
| | | | | 341/61 |
| 7,668,256 | B2* | 2/2010 | Giles | H04L 27/38 |
| | | | | 398/189 |
| 7,817,068 | B2* | 10/2010 | Ghoneima | H04L 25/45 |
| | | | | 341/55 |
| 7,860,097 | B1* | 12/2010 | Lovett | H04L 49/357 |
| | | | | 370/422 |
| 8,121,205 | B1* | 2/2012 | Zheng | H04L 1/0063 |
| | | | | 375/259 |
| 8,259,847 | B2* | 9/2012 | Zheng | H04L 25/497 |
| | | | | 375/295 |
| 8,473,690 | B1* | 6/2013 | Condict | G06F 12/0815 |
| | | | | 711/155 |
| 8,564,328 | B2* | 10/2013 | Stojanovic | H04L 25/4917 |
| | | | | 326/82 |
| 9,049,075 | B2* | 6/2015 | Juenemann | H04L 27/02 |
| 9,432,082 | B2* | 8/2016 | Ulrich | H04L 1/0668 |
| 10,020,966 | B2* | 7/2018 | Shokrollahi | H04L 25/08 |
| 11,144,696 | B1* | 10/2021 | Sul | G06F 11/261 |
| 11,159,153 | B2* | 10/2021 | Lee | H04L 27/06 |
| 2008/0019460 | A1* | 1/2008 | Giles | H04L 27/362 |
| | | | | 375/329 |
| 2010/0094999 | A1* | 4/2010 | Rama | G06F 9/4843 |
| | | | | 709/225 |
| 2010/0149427 | A1* | 6/2010 | Limberg | H04N 21/4382 |
| | | | | 348/724 |
| 2012/0008723 | A1* | 1/2012 | Stojanovic | H03L 7/091 |
| | | | | 375/355 |
| 2012/0033760 | A1* | 2/2012 | Zheng | H04L 25/4904 |
| | | | | 375/295 |
| 2012/0147990 | A1* | 6/2012 | Zheng | H04L 25/4917 |
| | | | | 375/295 |
| 2012/0288027 | A1* | 11/2012 | Stojanovic | H04B 1/0475 |
| | | | | 375/295 |
| 2013/0094542 | A1* | 4/2013 | Kim | G06F 13/38 |
| | | | | 375/219 |
| 2015/0055694 | A1* | 2/2015 | Juenemann | H04L 25/0276 |
| | | | | 375/233 |
| 2015/0071312 | A1* | 3/2015 | Batshon | H04L 1/0056 |
| | | | | 398/115 |
| 2015/0089209 | A1* | 3/2015 | Jacobs | G06F 21/575 |
| | | | | 713/1 |
| 2016/0343290 | A1* | 11/2016 | Wang | G09G 3/20 |
| 2019/0385057 | A1* | 12/2019 | Litichever | G06N 3/08 |
| 2020/0066299 | A1* | 2/2020 | Oberg | G11B 5/4923 |
| 2020/0339067 | A1* | 10/2020 | Kim | H04L 67/125 |

OTHER PUBLICATIONS

Lei, Yi, et al., "Decoding Staircase Codes With Marked Bits", Cornell University, arXiv:1811:08857v1, Nov. 21, 2018, 6 pages.

Zhang, Geoff, et al., "A Tutorial on PAM4 Signaling for 56G Serial Link Applications", 2017, http://www.oldfriend.url.tw/article/IEEE_paper/PAM4/SLIDES_10_PAM4_Signaling_for_56G_Serial_Zhang_1_.pdf, Accessed Feb. 4, 2020, 105 pages.

Zhang, Yan, et al., "Odd/Even Bus Invert With Two-Phase Transfer for Buses With Coupling", International Symposium on Low Power Electronics and Design (ISLPED), Aug. 2002, 4 pages.

Sotiriadis, Paul P. et al., "Low Power Bus Coding Techniques Considering Inter-Wire Capacitances", Custom Integrated Circuits Conference, May 2000, 4 pages.

U.S. Department of Energy, "Top Ten Exascale Research Challenges", DOE ASCAC Subcommittee Report, Feb. 10, 2014, 86 pages.

Jacobvitz, Adam N. et al., "Coset Coding to Extend the Lifetime of Memory", International Symposium on High Performance Computer Architecture (HPCA), Feb. 2013, 12 pages.

Seyedzadeh, SeyedMohammad, et al., "Enabling Fine-Grain Restricted Coset Coding Through Word-Level Compression for PCM", International Symposium on High Performance Computer Architecture (HPCA), Feb. 2018, 12 pages.

Wheeler, Bob, "Prepare for Copackaged Optics: Limits on Serdes Speed Will Drive Transition to Optical I/O", The Linley Group, Microprocessor Report, Sep. 30, 2019, 5 pages.

* cited by examiner

ENCODING OF SYMBOLS FOR A COMPUTER INTERCONNECT BASED ON FREQUENCY OF SYMBOL VALUES

GOVERNMENT LICENSE RIGHTS

This invention was made with Government support under the PathForward Project with Lawrence Livermore National Security (Prime Contract No. DE-AC52-07NA27344, Subcontract No. B620717) awarded by the Department of Energy (DOE). The Government has certain rights in this invention.

BACKGROUND

Large-scale data centers, cloud computing infrastructure, and wireless applications typically demand large communication bandwidth to transfer large amounts of data while maintaining low power consumption and a low cost per transferred bit. Various protocols and mechanisms have been developed to assist with these data transfers. For example, the Peripheral Component Interconnect (PCI) Special Interest Group (SIG) ("PCI-SIG") has set forth specifications involves the use of pulse amplitude modulation (PAM) signaling such as PAM-2, PAM-4, and PAM-8 signaling. The PAM-4 signaling provides twice the bandwidth of PAM-2 signaling but generally entails increased power consumption and potential challenges in signal integrity due to additional signal states. PAM-4 signaling generally uses four voltage levels or light characteristics to represent four combinations of 2 bits of logic: 11, 10, 01, and 00. PAM-8 signaling uses eight levels to represent eight combinations of 3 bits of logic: 111, 110, 101, 100, 011, 010, 001, and 000. Furthermore, PAM-4 and PAM-8 signaling are susceptible to crosstalk errors.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Described herein are techniques to reduce power consumption and improve signal integrity of an interconnect between components by employing symbol training and pulse amplitude modulation signaling (PAM) and similar types of signaling such as discrete multitone (DMT) schemes. The interconnect employs a deterministic counter-based mechanism that trains the interconnect to communicate symbols between a sending device (e.g., an encoder) and a receiving device (e.g., a decoder) with a relatively small Hamming distance between sequential symbols. The counter-based mechanism reduces or obviates the need to attach auxiliary bits to the transmitted symbols thereby further reducing power consumption and improving signal integrity.

In previous PAM-based systems, one or more auxiliary bits are used to indicate how signaling is encoded or inverted. To illustrate use of auxiliary bits, an interconnect employs data encoding to reduce symbol transitions communicated over the interconnect, thereby reducing the overall resource costs (e.g., reducing power consumption) of transmitting the symbols. That is, the interconnect encodes selected data blocks into other data blocks or data symbols to minimize the occurrence of data patterns that are costly to transmit. Such encoding comes at the cost of sending one or more auxiliary bits. Due to encoding, the interconnect adds metadata (e.g., auxiliary bits) to the encoded data blocks to allow eventual decoding and retrieval of the data. An example of such encoding is data bus inversion (DBI) wherein the interconnect transmits either the original data or its complement, depending on a cost of transmission. DBI is configured to send a lower of two possible transmissions. To decode an encoded block, a receiver uses, for example, one auxiliary bit per 8-bit translated data block. The auxiliary bit therefore adds a 12.5% encoding overhead (1 bit out of 8 bits, or 12.5%).

Another example of a previous encoding scheme is transition pattern coding (TPC) wherein the interconnect maps a data block into multiple codewords and then logic selects the codeword that minimizes a number of transitions. In this case, the encoding requires $\log_2(\#codewords)$-bits to decode the selected codewords in the decoder but also requires one or more auxiliary bits to decode the codewords.

Generally, each auxiliary bit used across an interconnect consumes both power and interconnect bandwidth. Techniques described herein reduce symbol transitions in PAM-4 based interconnects without adding auxiliary bits to data blocks. The techniques provide power savings and improve signal integrity by implementing the same trainer in both an encoder and a decoder. Training is performed in parallel with transmission and reception of a symbol sequence. Since a similar trainer is used in both the encoder and decoder of the interconnect, auxiliary bits are not used, thereby conserving both power and bandwidth.

Specific embodiments of the techniques described herein include training using one or more symbol counters. The counters are used to find one or more most recently used (MRU) symbols during a current (first) epoch "M" for use in a next (second) epoch "M+1". The second epoch M+1 is subsequent in time to the first epoch M. An epoch as used herein is a predefined period of time or, equivalently, a number of symbols to be transmitted across the interconnect between devices or components. At the end of the current epoch, such as at an end of a last symbol block at the end of the current epoch, one or more of the most recently used symbols are stored so that the most recently used symbols are used to encode the original symbols in the next epoch (i.e., epoch M+1).

According to a first embodiment, as a specific example of symbol counting for an encoder for a PAM-4 based interconnect, for a set of symbol blocks in epoch M, each symbol block has 4 possible values (00, 01, 10, and 11). Each position in each symbol block is counted separately. That is, at least a set of four-by-four numbers (for a total of 16) is counted for the epoch M to identify one or more MRU numbers for each position in the symbol blocks. Examples of MRU counts for a set of 2,500 symbol blocks are as follows:

[1410, 355, 417, 318];
[569, 628, 299, 1004];
[381, 719, 816, 584]; and
[671, 454, 665, 710].

A count in each symbol position within the symbol block sums to 2,500. As shown in the first position, the (first) symbol value of 00 is most frequent. For the other three positions, the symbol values that are most frequent are: 11, 10, and 11, respectively. For transmission, using these values, the symbols from each symbol block that is transmitted over the interconnect would be XOR'd with these values according to a single-MRU-value scheme. That is, for each symbol block [WW, XX, YY, ZZ] where W, X, Y, and Z take a value of 0 or 1, these symbol values are XOR'd with [00, 11, 10, 11] respectively before being transmitted. Statistically, this encoding and transmission is likely to reduce energy used to transmit symbol blocks over the interconnect as measured over time.

Because the energy consumption is lower for transmitting a symbol value of 11 versus symbol value 00 over the interconnect, and where XOR'ing MRU symbols and circular shift register symbols generates more 0's than 1's, a system is configured to perform XNOR'ing on the MRU symbols and circular shift register symbols. In this alternative, the system generates more 1s than 0s and transmission across the interconnect thereby sends a lower-energy series of symbols between devices. In summary, depending on interconnect topology and the cost of a 0 symbol value versus 1 symbol value, either an XOR operation or an XNOR operation is selected to not only reduce symbol transitions, but also to transmit a lower cost series of symbols across the interconnect.

A similar encoding scheme is used when tracking two or more MRU values for each symbol position before encoding symbol values for transmission. According to some embodiments, the scheme improves across all lower three values (00, 01, and 10) in rank order of frequency (since 01 and 10 would have a same cost in energy the same as one another for transmission purposes). That is, a most frequent symbol in each position in the symbol block goes from XX to 00, a second-most frequent symbol goes from YY to 01, and third-most frequent symbol goes from ZZ to 10 when sent across the interconnect. The least-frequently encountered symbol is encoded as 11 before being sent across the interconnect. In this way, an energy of transmission is reduced.

A decoder at a receiving end of the interconnect uses a same methodology as the encoder—a same counting scheme—and the decoder thereby generates the same encodings as the encoder in parallel with receiving symbols. By having the same MRU symbol encodings as the transmitter, the receiver is able to decode the incoming symbols without use of one or more auxiliary bits sent across the interconnect. Since the training and symbol transmission are done in parallel by each of the encoder and decoder, the proposed scheme does not slow down symbol transmission across the interconnect while at the same time reduces symbol transitions in the symbol transmission based on a count of one or more most recently used (MRU) symbols. MRU encoding and decoding is described herein as one example of various types of symbol schemes for use to reduce energy consumption across the interconnect.

Figure 1:
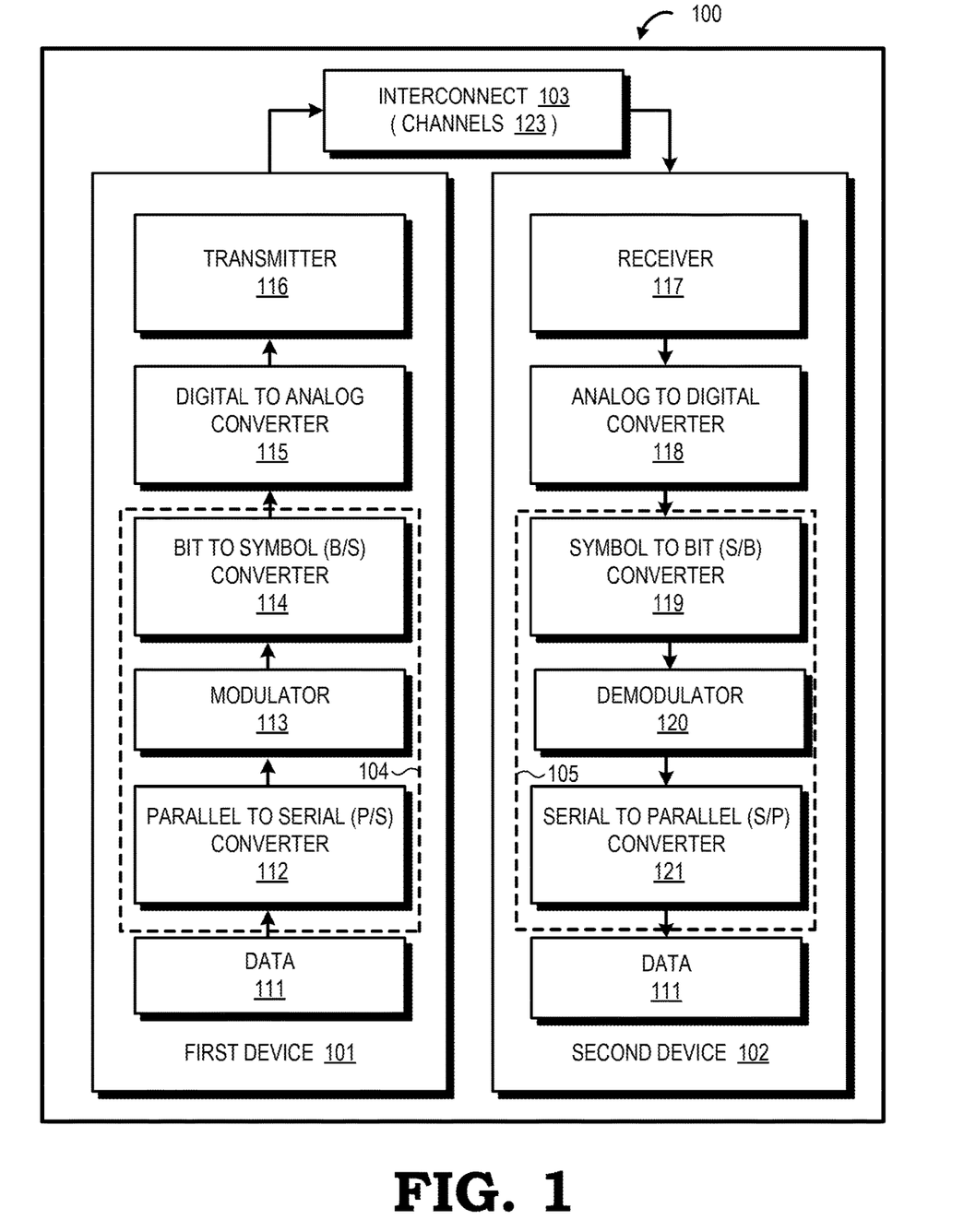
FIG. 1 is a block diagram of a system having a sequence learning mechanism for PAM-based interconnects in accordance with some embodiments.

FIG. 1 is a block diagram of a system 100 including a pair of devices 101, 102 separated from each other across an interconnect 103 in accordance with some embodiments. The interconnect 103 includes one or more channels 123 where each channel includes one or more media (e.g., wires, wired cables, light-carrying fiber) across which signals are transmitted.

Examples of interconnects 103 include chip-to-module interconnects, chip-to-chip interconnects, and chip-to-backplane interconnects. Chip-to-module interconnects are also referred to as very short reach (VSR) interconnects. Chip-to-module interconnects are found in many modern communication systems that support pluggable modules at a front faceplate. An electrical link connects these pluggable modules and these interconnects extend up to approximately 10 cm. The VSR chip-to-module interface can include a single connector. Chip-to-chip interconnects are mid-range interconnects such as within a same printed circuit board assembly (PCBA) or on a daughter card or shorter midplane. By definition, a chip-to-chip interface is a relatively short range connection such as up to approximately 50 cm between transmitter and receiver. The mid-range interface also includes a single connector in some embodiments. Chip-to-backplane interconnects are an example of a long reach (LR) interconnect such as between two cards across a backplane or midplane within a chassis of a computing system. LR interconnects are generally less than about one meter with up to two connectors. By way of example, in the system 100, signals are passed as voltages or changes in voltages or as light between a transmitter 116 and a receiver 117. The channels 123 are sometimes referred to as lanes. The interconnect 103 thereby includes one or more lanes across which are communicated a respective series of symbols. The system 100 is representative of various types of systems in which the techniques described herein are used.

Broadly, data 111 are sent from a first device 101 as a transmitter to a second device 102 as a receiver in the system 100. The data 111 in the first device 101 are encoded such as by one or more components or stages that are collectively referred to as the encoder 104. Encoding of symbols yields encoded symbols. In the second device 102, received and encoded symbols are decoded such as by one or more components or stages that are collectively referred to as the decoder 105. Encoding includes dividing an input symbol stream into a serial sequence of epochs or batches of symbols and identifying a frequency of one, two, or more symbols relative to other symbols of a symbol scheme. For a PAM-4 type interconnect where four values of symbols are possible, the encoder 104 identifies which one or more symbols are most frequently used in a particular epoch. The transmitter device 101 then transmits in a next epoch encoded symbols based on a frequency of the symbols in the previous epoch. That is, original symbols are encoded by the encoder 104 into encoded symbols and the encoded symbols are transmitted from the first device 101 to the second device 102. Relative to the unencoded stream of symbols, based on a frequency count of symbol values, more zero symbols (e.g., 00 value, 000 value) are sent across the interconnect 103 compared to non-zero symbols.

In some embodiments, the mechanism processes iteratively a fixed number of symbols or symbol blocks and records symbol similarities across symbol (data) blocks. In other embodiments, more zero symbols and more intermediate symbols (e.g., 01, 10; and 110, 101, 100, 011, 010, and 001) are sent across the interconnect 103 than higher value symbols as these symbol values are used to encode data (symbols) prior to sending the data (as symbols) across the interconnect. Each encoded symbol is sent at a same or a different energy value across the interconnect 103 as its original symbol value but where the overall energy consumption for one or more epochs is reduced based on the encoding.

In terms of specific physical components with which to use the techniques, and by way of example and not limitation, improved PAM signaling as described herein can be used across various interconnects such as in or across a Peripheral Component Interconnect (PCI) Express (PCIe) connection where PCIe is a common interface between devices and components such as between a motherboard and a graphics card, a hard drive, a solid-state drive (SSD), a Wi-Fi end point where Wi-Fi is a set of standards of the Institute of Electrical and Electronics Engineers (IEEE) 802.11 protocol, and an Ethernet hardware device. PCIe has numerous improvements over older standards including a higher maximum system bus throughput. Some implementations of a recent revision of the PCIe standard (generation 6 ("Gen6")) provides a hardware implementation of PAM-4 and the techniques are applicable in this environment. Other coherent interconnects use PAM-4 and include, by way of example and not limitation: a Compute Express Link (CXL) interconnect for high-speed CPU-to-device and CPU-to-memory, a cache coherent interconnect for accelerators (CCIX) interconnect, and a Gen-Z-type interconnect that provides memory-semantic access to data and devices. These types of interconnects use the PCIe PHY connection and PAM-4. The techniques described herein are applicable in these and other environments. Further, many optical links in current datacenters are based on multi-mode optical fibers and Vertical Cavity Surface Emitting Lasers (VCSELs). Traditional non-return-to-zero (NRZ) signaling is used in some implementations of these and 56G communication mechanisms. PAM-4 signaling is also used in these optical-based interconnect environments and these environments are capable of data transfer speeds higher than non-return-to-zero (NRZ) signaling. The described techniques are used across each of one or more lanes or channels that make up a particular interconnect Turning to the embodiment of FIG. 1, in the first device 101, the data 111 are converted into a serial stream of bits by a parallel-to-serial (P/S) converter 112. In some embodiments, the serial stream is subjected to modulation by one or more components of a modulator 113 depending on the type of devices 101, 102 in the system 100, the type of interconnect 103 between the devices 101, 102, and communication protocol used for serially communicating between the devices 101, 102. For example, zeros are padded to the serial stream by the modulator 113 or the serial stream is encrypted. Next, the serial stream of bits is converted into a stream of symbols by components of a bit-to-symbol converter 114. In some embodiments, together, the P/S converter 112, the modulator 113, and the B/S converter 114 make up the encoder 104. While the P/S converter 112, the modulator 113, and the B/S converter 114 are illustrated as separate components or entities, these components of the first device 101 form part of a single encoder 104 for the first device 101 in some embodiments. In the first device 101, the symbol stream is prepared for transmission by the transmitter 116 by a digital-to-analog converter 115. The transmitter 116 sends analog signals representing a stream of symbols across the interconnect 103.

The second device 102 includes various components that perform an inverse process as that performed by the first device 101. For example, the second device 102 includes the receiver 117 that receives the analog signals sent by the transmitter 116. An analog-to-digital converter 118 creates a received serial sequence of symbols. A symbol-to-bit (SB) converter 119 generates a sequence of bits for a demodulator 120. The demodulator 120 of the receiving or second device 102 performs an inverse of one or more functions that were performed by the modulator 113 of the first device 101. A serial-to-parallel (S/P) converter 121 operates on a serial stream of demodulated and received bits. When all of the functions have been performed correctly by the devices 101, 102, a same set of data 111 is available in the second device 102. In some embodiments, the components of the devices 101, 102 perform these same functions for each channel 123 of the interconnect 103.

Figure 2:
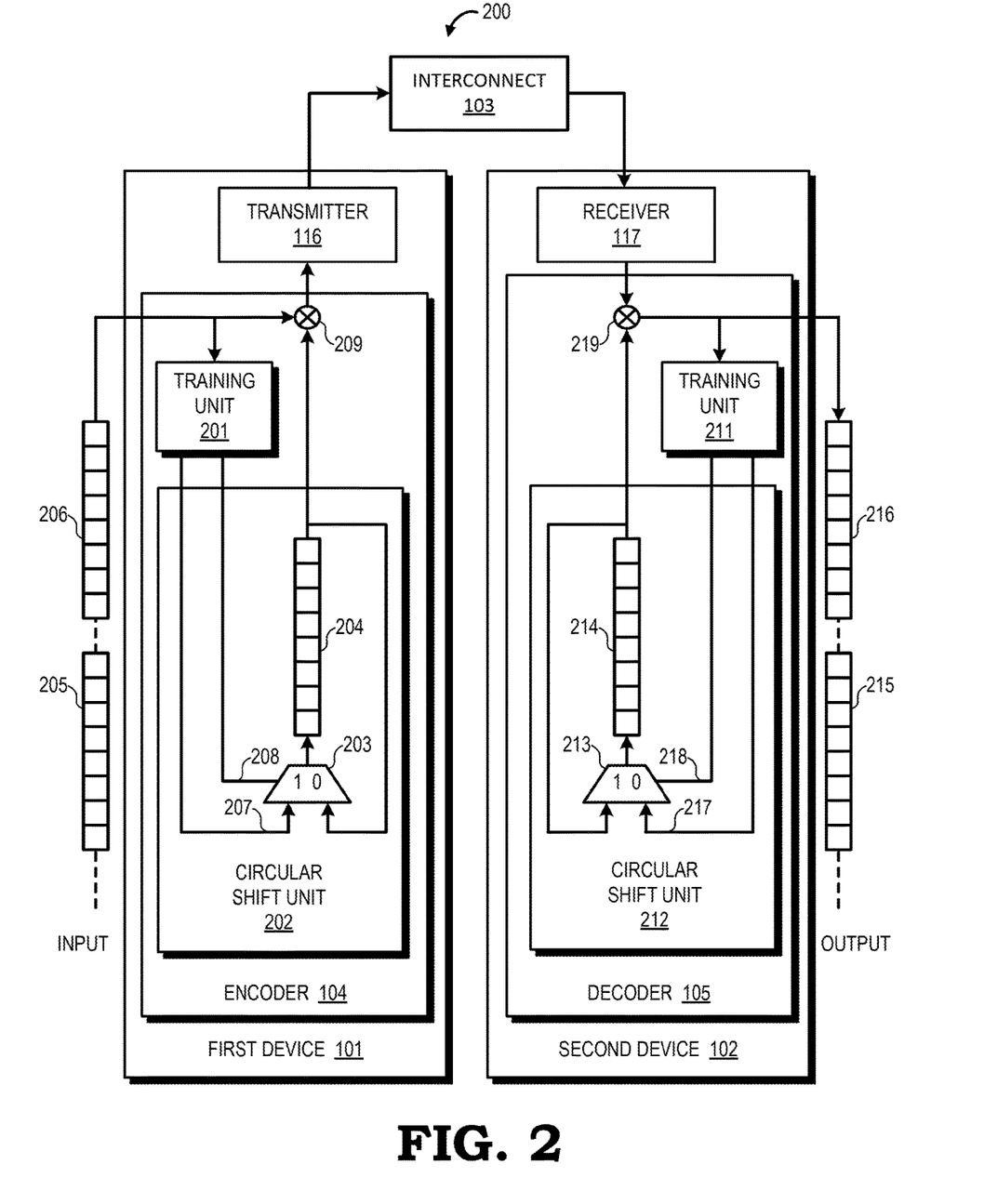
FIG. 2 is a block diagram of components of the sequence learning mechanism in in the devices of the system illustrated in FIG. 1 in accordance with some embodiments.

FIG. 2 is a block diagram of the devices 101, 102 of the system 100 illustrated in FIG. 1 in accordance with some embodiments and is referred to as a system 200. The devices 101, 102 are separated by the interconnect 103. The first and second devices 101, 102 include the encoder 104 and the decoder 105, respectively. The encoder 104 includes a (first) training unit 201 and a (first) circular shift unit 202. The circular shift unit 202 includes a multiplexer 203 and a circular shift register 204. In operation, a first block of symbols 206 is provided to the first device 101. For example, the first block of symbols 206 is made available in a random access memory (RAM) (not illustrated) and the first device 101 reads the values from the RAM. A second block of symbols 205 is available after the first block of symbols 206 and the second block 205 is next in time after the first block 206. Although not illustrated, by way of example, each symbol is two, three, or some other number of binary values that are grouped together as one symbol or transfer unit and this unit has a certain bit length corresponding to the number of binary values. In parallel, the first block of symbols 206 is received by and processed by the training unit 201 and received and processed by a first XOR unit 209. The first XOR unit 209 provides a stream of symbols to a transmitter 116. The transmitter 116 sends or otherwise transmits the XOR'd sequence of symbols onto or across the interconnect 103. In some embodiments of the device, although not illustrated, the encoder 104 includes a zero compressor that compresses zero-value symbol values prior to communicating encoded symbols to the decoder 105 across the interconnect 103, and the decoder 105 includes a corresponding zero decompressor so as to accurately reproduce the original symbol stream across the interconnect 103.

Once the training unit 201 reaches a specified point in processing symbols, for example at an end of an epoch of N number of symbol blocks, the training unit 201 passes a new set of most recently used (MRU) symbols 207 to the circular shift register 204. The training unit 201 then uses the new set of MRU symbols 207 until another update is provided to the circular shift register 204. The training unit 201 does so by sending an update signal 208 to the multiplexer 203. The MRU symbols 207 are transferred from or made available by the training unit 201 and stored in the circular shift register 204 for use by the XOR unit 209. In some embodiments, for any given epoch M, the training unit 201 passes a new set of MRU symbols 207 at the end of training on an N number of blocks of symbols such as at an end of an epoch M that includes the first block of symbols 206 and the second block of symbols 205. In other embodiments, a new set of MRU symbols is passed to the circular shift register 204 after a certain number of symbols are encoded or after a certain number of blocks of symbols are processed. By way of example, at an end of processing of symbols for the epoch M, for 10 symbols per block and 10,000 symbol blocks in the epoch M, the training unit 201 has processed approximately 100,000 symbols. By having processed such a relatively large number of symbols, the training unit 201 has a reasonable sampling of symbol values so as to fairly accurately identify which one, two, or more symbol values are most recently used. Generally, in embodiments of the devices 101, 102 a same number of blocks of symbols 205, 206 occur in each epoch (e.g., epoch M, epoch M+1). A start, an end, a size, or some combination of the same of an epoch is set at design time according to some embodiments and the epoch is thereby fixed for a particular system 100, 200, device pair 101, 102, or encoder/decoder pair 104, 105. A first device having a particular transmitter and epoch size is then matched by a second device having a corresponding set of components to process symbols according to a same sized epoch when the first device is designed or manufactured by a different entity than the second device.

In the system 200, the second device 102 includes the decoder 105. The decoder 105 includes a second training unit 211, a second circular shift unit 212, and a second XOR unit 219. The second training unit 211 is configured similarly to the first training unit 201. In operation, the second training unit 211, upon training on a same set of symbols that has been communicated to the second device 102 from the first device 101. Operation of the second training unit 211 on the same set of symbols yields a same result of MRU symbols 217 as a first set of MRU symbols 207. The second circular shift unit 212 includes its own (second) multiplexer 213 and its own (second) circular shift register 214. The MRU symbols 217 are provided to the second circular shift register 214 upon receiving a (second) update signal 218 by the training unit 211 at the end of processing an epoch of blocks of symbols. A current set of MRU symbols in the second circular shift register 214 is used by the second XOR unit 219 when operating on incoming symbols that are received by the receiver 117.

In terms of sequence of events at the second device 102, once sent by the transmitter 116 across the interconnect 103, the receiver 117 of the second device 102 detects and receives each XOR'd symbol. Each received encoded symbol at the second device 102 is processed by the second XOR unit 219 and made available as an output. For example, previous in time, a third symbol block 216 corresponding to a block of symbols at a time N−1 has already been received by the second device 102. A fourth symbol block 217 corresponding to a block of symbols at a time N−2 also has already been received by the second device 102. The symbol blocks 205, 206, 215, 216 make up a symbol stream that has been processed by the devices 101, 102 and that has been or is to be sent across the interconnect 103.

While the devices 101, 102 are shown next to each other, it is understood that a size of the interconnect 103 is arbitrary and any such actual distance or separation between the devices 101, 102 depends on a particular physical (PHY) connection between the devices 101, 102. In some embodiments where the physical connection is electronic, the interconnect 103 and size thereof if generally on the order of 1-5 mm, 1-2 cm, or up to approximately 2 meters where the interconnect 103 is a backplane in a server cabinet and the interconnect involves wires or wire pairs. Where the interconnect 103 is a laser-based or light-based interconnect, a distance between the devices 101, 102 can be substantively more than a wire-based interconnect.

Figure 3:
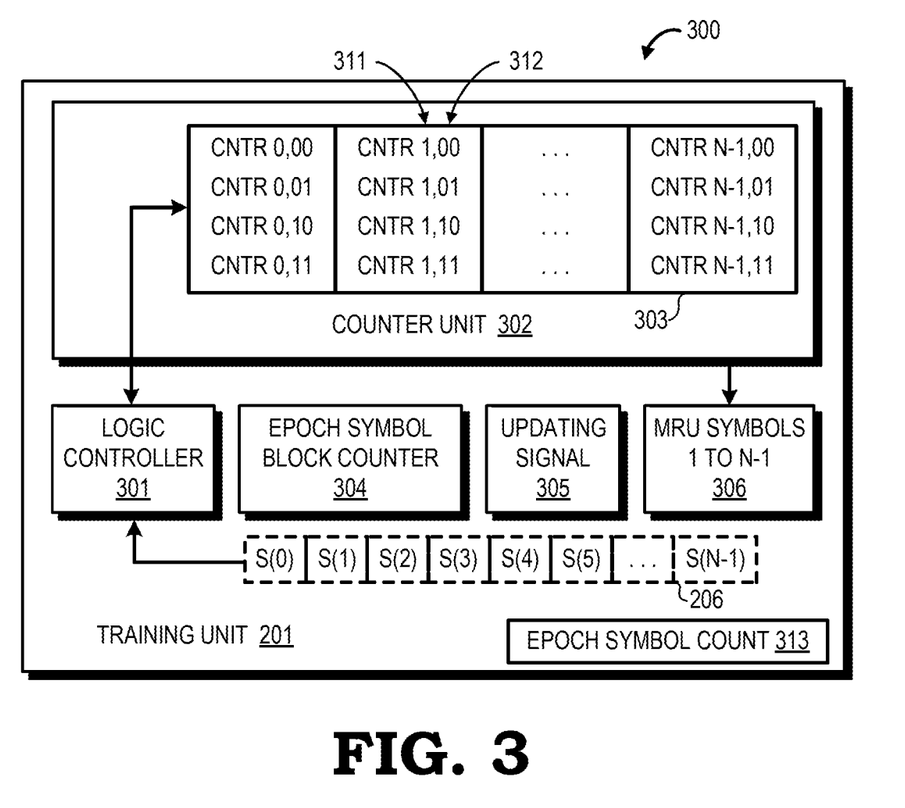
FIG. 3 is a block diagram of a training unit of the system illustrated in FIG. 2 in accordance with some embodiments.

FIG. 3 is a block diagram 300 of the training unit 201 of the system 200 illustrated in FIG. 2 in accordance with some embodiments. The training unit 201 includes a logic controller 301 and a counter unit 302. The counter unit 302 includes a counter table 303. The counter table 303 is one particular embodiment for keeping track of counts of symbols processed by the training unit 201. The training table 303 has a set of rows and columns for keeping track of an amount of each of the symbol values in each position in a set of blocks of symbols (e.g., a set of N number of blocks in a particular epoch M).

As illustrated in the diagram 300, the training table 303 includes four rows: one row for each of four values or "levels" for a PAM-4 type of interconnect as an embodiment of the interconnect 103. For a PAM-4 type interconnect, each symbol has two bits of data 312 that can take the possible values of: 0,0 as in a first row; 0,1 as in a second row; 1,0 as in a third row; and 1,1 as in a fourth row. The text "CNTR" is an abbreviation for "counter" in each cell in the table 303. Each column is indexed 311 from 0 to N−1. For a PAM-8 type of interconnect, there would be eight rows corresponding to three bits per symbol, and one row for each of the eight permutations of values possible for the respective PAM-8 symbols. PAM-8 type interconnects have eight separate values or levels of amplitude of a carrier signal when communicating across the interconnect 103 such as across each channel of the interconnect when multiple PAM instances are used in the interconnect 103.

In some embodiments, where an adaptive trainer is needed, the logic controller 301 is configured to select a symbol block size based on one or more characteristics of a symbol stream processed by the encoder 104. Once the symbol block size N is identified, this size is communicated to the decoder 105 across the interconnect 103 for decoding symbols transferred across the interconnect 103. By way of example, when symbols for a bit stream that is subsequently turned into a symbol stream, a system is configured to identify a particular type of workload or underlying data type associated with the symbol stream. For a stream of double precision floating point bits (e.g., 64 bits, 128 bits) a training unit selects a first numerical value (e.g., 16, 32, 64) for double precision floating point workloads as a first symbol block size. For a stream of integer bits (e.g., 32 bits, 64 bits) a training unit selects a second numerical value (e.g., 8, 16, 32) for integer workloads as a second symbol block size.

In the diagram 300, the training unit 201 is training on symbols S of the first block of symbols 206. The symbols are indexed 0 through N−1 as shown by S(0), S(1), and so forth up to S(N−1). The first block of symbols 206 is provided to and processed by the logic controller 301. In some embodiments, each symbol S is processed one at a time in sequence as the symbol arrives to the training unit 201. In other embodiments, the block of symbols 206 is received by the training unit 201 and the symbols of the first block of symbols 206 is processed in parallel, each symbol S(i) for each column in the training table 303. For each symbol (0 through N−1), the logic controller 301 updates one or more respective cells in the training table 303. In some embodiments, when the table 303 keeps a positive count of each of the symbol values in a set of blocks of symbols, a respective row in a respective column is updated, one for each symbol across all of the symbols in the set of blocks of symbols (e.g., N blocks in each particular epoch M). In some embodiments, the training unit 201 includes an epoch symbol count 313 that is incremented as symbols S are processed. When a value of the epoch symbol count 313 exceeds a symbol threshold, the training unit 201 sends the update signal 208 to the multiplexer 203.

As a specific example of training, with reference to the diagram 300, when a particular symbol value for S(0) arrives (e.g., value 1,0), the logic controller 301 increments, by one, a value at a position at the first column and the third row. As each subsequent value of the first block of symbols 206 is processed, the logic controller 301 moves one column to the right. In this example, a particular row in the training table 303 would be incremented by one for the value of the symbol S(1). The logic controller 301 would then move to the next column and then process symbol S(2), and so forth until the logic controller 301 completes processing of all of the symbols in the first block of symbols 206. While the entire first block of symbols 206 is illustrated in the diagram 300, in operation and according to some embodiments, the training unit 201 is wired to receive and process a single symbol value at a time in order to keep a size of the training unit 201 to a minimum in the first device 101. A second training unit 211 that is substantively identical to the training unit 201 is provided for the second device 102 and operates in substantively the same way.

In other embodiments, depending on a size of each cell (e.g., 8 bits, 16 bits) of the training table 303, instead of counting upward for each symbol S(i), the logic controller 301 decrements (by one) each of the other three rows for a particular symbol. By decrementing (either from a starting value or from a maximum value), the training unit 201 and counter unit 302 are able to accurately keep a count of the symbol values while at a same time keeping a small size for the respective cells or registers in the counter table 303.

Figure 4:
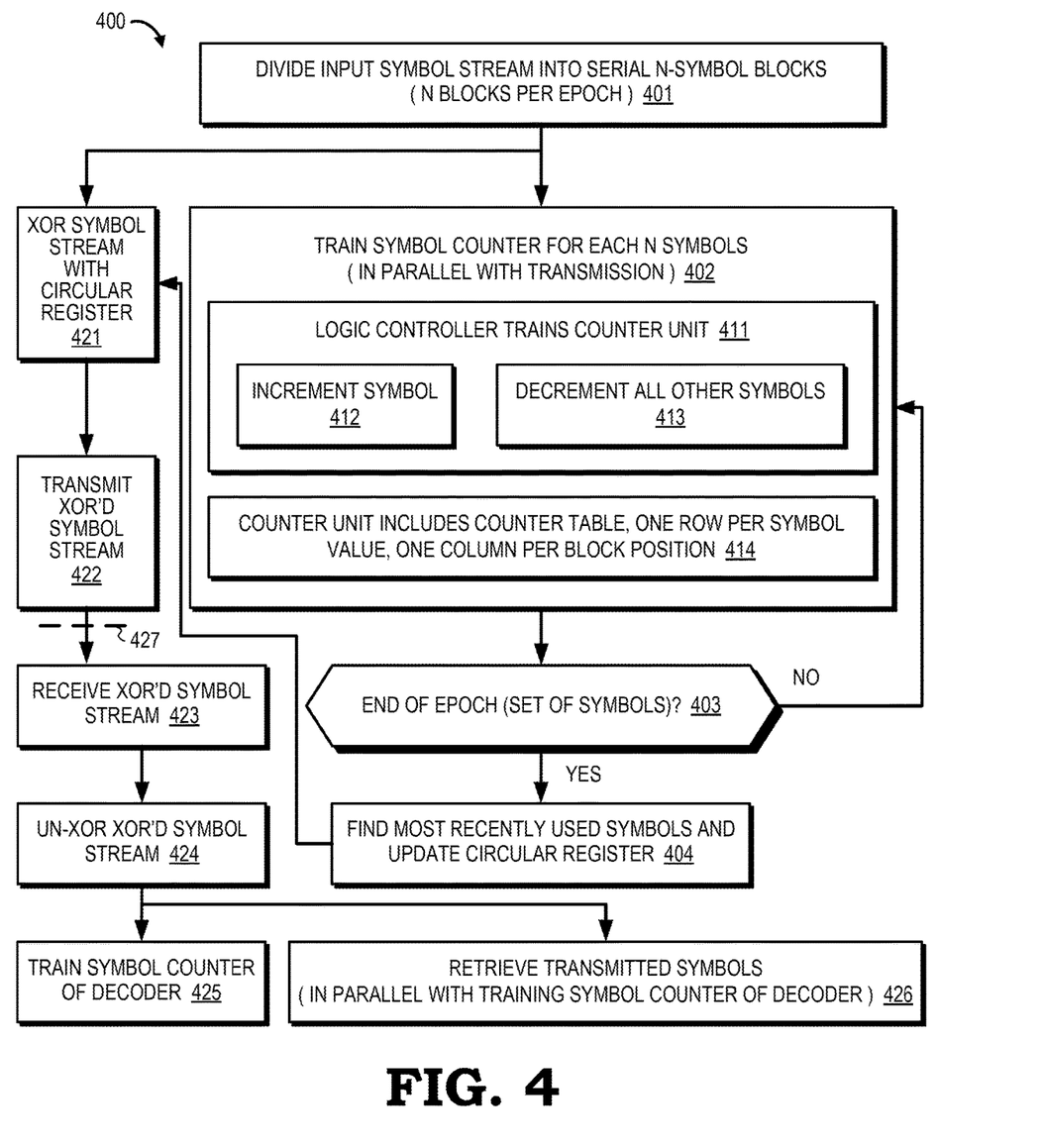
FIG. 4 is a flow diagram illustrating a method for a sequence learning mechanism for a PAM-based interconnect in accordance with some embodiments.

FIG. 4 is a flow diagram illustrating a method 400 for a sequence learning mechanism for a PAM-based interconnect such as the interconnect 103 in accordance with some embodiments. At block 401, the method 400 includes dividing an input symbol stream into a serial set of n-symbol blocks such N number of blocks per epoch. That is, a block of symbols includes N number of symbols to be encoded and transmitted from the first device 101 to the second device 102. At block 402, a symbol counter is trained for each set of N number of symbols. At block 411, in some embodiments of training or learning of MRU symbols, a logic controller performs the acts of counting or training of a counter unit. At block 412, a count of a symbol of a certain value is incremented. As an alternative to block 412, at block 413, a count of a symbol of a certain value includes decrementing other possible values of the symbol by one. This action effectively increments a count for the value of the particular symbol. In some embodiments, and as indicated at block 414, a counter unit includes use of a counter table where each of a certain number of rows corresponds to a respective possible value for the symbols encountered in a stream of symbols. At block 414, there is one column in the counter table for each symbol position in a block of symbols.

In parallel with block 402 (training), at block 421, the method 400 includes performing an XOR operation with MRU symbols from a previous epoch. For example, the MRU symbols are stored in a circular register. At block 422, the XOR'd symbol stream is transmitted to a receiver. That is, on a first side of an interconnect as represented by the line 427, an encoder or a first device performs training in parallel with XOR'ing and transmitting of a symbol stream. On a second and subsequent side of the line 427, a second device or a decoder performs further steps in the method 400.

At block 423, a device such as the second device 102 receives the XOR'd symbol stream. At block 424, the second device or decoder thereof performs an inverse of the XOR operation of the encoder. At block 425, a symbol counter of the decoder is trained with the received symbol stream. In parallel with the decode training, at block 426, the transmitted symbols are retrieved and provided as an output that has been received over an interconnect such as the interconnect 103 illustrated in FIGS. 1 and 2.

At block 403, a first trainer identifies whether training on a set of symbols is complete. For example, the trainer identifies whether an end of a particular epoch of N number of blocks of symbols is over. If not, training continues at block 402. If so, at block 404, the trainer identifies or finds one or more new most recently used (MRU) symbols. The new MRU symbols are then used, at block 421, to XOR subsequent symbols prior to transmitting the XOR'd symbols as part of processing the symbol stream.

The method 400 is one embodiment of a particular implementation of processing a stream of symbols. Counted values in training unit can be stored in registers. A particular symbol block size and use of a particular counter size is a trade-off between a certain amount of required hardware energy overhead needed to operate a particular embodiment and the energy saving resulting from a symbol transition reduction. Since m-bit counters in a counter table (e.g., table 303) are in charge of tracking the MRU symbols, a number of blocks per epoch is selected such as at design time based on the counter size to guarantee that the counters are trained enough during the training process.

Figure 5:
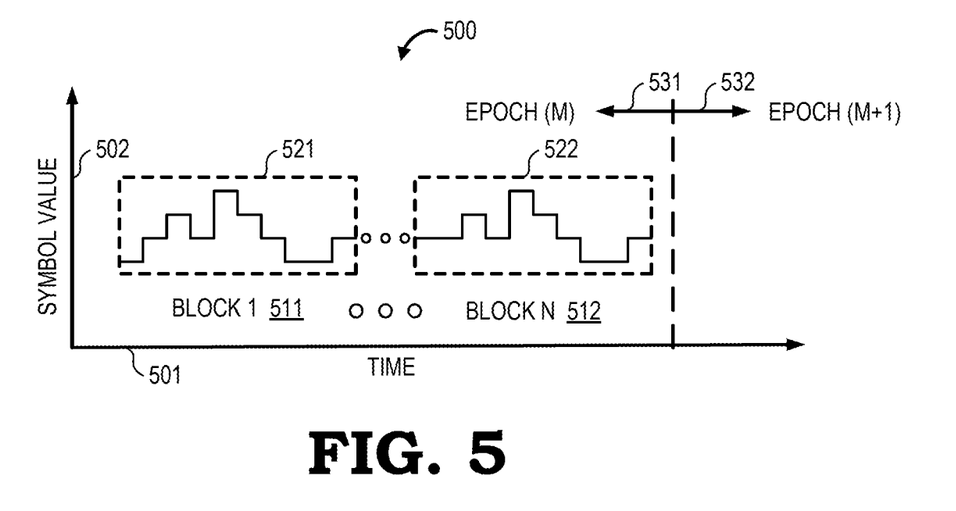
FIG. 5 is a graph illustrating epochs of symbols to be sent across an interconnect in accordance with some embodiments.

FIG. 5 is a graph 500 illustrating epochs of symbols to be sent across an interconnect in accordance with some embodiments. In the graph 500, time is represented along a first (horizontal) axis 501, and symbol values are represented along a second (vertical) axis 502. For any particular epoch M 531, a symbol stream is, at least conceptually, divided into N number of blocks. For example, a first block 511 and an Nth ("block N") 512 are illustrated as a first and last block in a first epoch. Symbol values 521, 522 of the blocks of symbols 511, 512 are used to train for the MRU symbols that are used to XOR the symbol stream to be transmitted and received in parallel with the training. At an end of each epoch, such as at an end of the first epoch M 531, a new set of MRU symbols are identified and used in a subsequent (second) epoch M+1 532.

In some embodiments, the apparatus and techniques described above are implemented in a system including one or more integrated circuit (IC) devices (also referred to as integrated circuit packages or microchips), such as the components of the devices described above with reference to FIGS. 1-5. Electronic design automation (EDA) and computer aided design (CAD) software tools may be used in the design and fabrication of these IC devices. These design tools typically are represented as one or more software programs. The one or more software programs include code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments.

However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. The benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitation is intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
   identifying, by a training unit of an encoder, a number of occurrences of each symbol value in a first set of symbol blocks in a first epoch, wherein each symbol value has one of at least four possible values; and
   in a second epoch:
      encoding each symbol of another set of symbol blocks based on the identified number of occurrences of each respective symbol value in the first set of symbol blocks of the first epoch; and
      communicating, across an interconnect, each encoded symbol value.

2. The method of claim 1, wherein:
   encoding each symbol includes selecting between performing a first XOR operation or a first XNOR operation based on the identified number of occurrences of each respective symbol value in the first set of symbol blocks of the first epoch as identified by the training unit of the encoder.

3. The method of claim 2, wherein the identifying the number of occurrences of each symbol value in the first set of symbol blocks includes:
   storing, in a first circular shift unit, a set of most-recently-used (MRU) symbol values for the first epoch based on the respective symbol values; and
   the first XOR operation is performed using the MRU symbol values of the first circular shift unit as input or the first XNOR operation is performed using the MRU symbol values of the first circular shift unit as input.

4. The method of claim 3, further comprising:
   providing an update signal at an end of each epoch to a multiplexer of the first circular shift unit that causes a first circular shift register to store a new set of MRU symbol values.

5. A method comprising:
   identifying, by a training unit of a decoder, a number of occurrences of each symbol value in a first set of encoded symbol values in a first epoch, wherein each symbol value has one of at least four possible values; and
   in a second epoch:
      decoding each symbol of another set of symbol values based on the identified number of occurrences of each respective symbol value in the first set of symbol blocks of the first epoch; and
      communicating, across an interconnect, each encoded symbol value.

6. The method of claim 5, wherein decoding comprises:
   counting the number of occurrences of amplitude values of symbols of each symbol block of the first set of symbol blocks;
   identifying a set of MRU symbol values by a circular shift unit;
   storing the set of MRU symbol values; and
   performing an XOR operation on each encoded symbol of the symbol blocks using identified MRU symbol values of a second circular shift unit as input to the XOR operation.

7. A system for serially communicating data as symbols over an interconnect, the system comprising:
   an encoder including:
      a first training unit to identify a number of occurrences of symbol values of a first set of symbol blocks in a first epoch, wherein respective symbol values encode one of a plurality of at least four possible symbol values as encoded symbols;
      in a second epoch subsequent in time to the first epoch, the encoder to encode each symbol of another set of symbol blocks based on the identified number of occurrences of each respective symbol value in the symbol blocks of the first epoch; and
   a transmitter coupled to the encoder and the interconnect, wherein the transmitter transmits the encoded symbols onto the interconnect.

8. The system of claim 7, wherein the encoder further includes:
   a first circular shift unit to store a set of most-recently-used (MRU) symbol values based on the identified number of occurrences of the symbol values as identified by the first training unit of the encoder.

9. The system of claim 8, wherein the first training unit provides an update signal at an end of a last symbol block of the first epoch to a multiplexer of the first circular shift unit that causes a first circular shift register to store a new set of MRU symbol values based on the identified number of occurrences of the symbol values in the symbol blocks of the set of N number of symbol blocks in the first epoch.

10. The system of claim 8, wherein the encoder further includes:
    a first XOR unit coupled to the first circular shift unit as input and to the interconnect as output.

11. The system of claim 8, wherein:
    the first training unit includes first registers for counts of the identified number of occurrences of symbol values in the set of symbol blocks; and
    the first training unit includes counts of symbol values processed by the encoder, in respective first registers of the first registers, for the symbols of the symbol blocks of the set of symbol blocks.

12. The system of claim 7, wherein the first training unit:
    selects a symbol block size based on a symbol stream processed by the encoder; and
    communicates the symbol block size to a decoder across the interconnect for decoding the symbols transferred across the interconnect.

13. The system of claim 12, wherein the first training unit selects a first numerical value for double precision floating point workloads as the symbol block size and a second numerical value different from the first numerical value for integer workloads.

14. The system of claim 7, wherein:
a bit length of each symbol is 3-bits, and wherein the interconnect is an eight-level pulse amplitude modulation (PAM-8)-based interconnect.

15. The system of claim 7, wherein:
the encoder maps each symbol block into one or more codewords;
the first training unit selects a codeword as a most-recently-used (MRU) codeword that has a minimum number of symbol transitions among existing codewords; and
the encoder sends the selected MRU codeword to a decoder across the interconnect.

16. The system of claim 7, wherein the interconnect is a four-level pulse amplitude modulation (PAM-4) interconnect.

17. A system, comprising:
a receiver; and
a decoder coupled to receive symbols over an interconnect via the receiver, wherein the decoder includes:
a training unit to identify a number of occurrences of symbol values of a set of symbol blocks for a first epoch;
wherein the decoder is to decode received symbol values of a second epoch based on the identified number of occurrences of symbol values.

18. The system of claim 17, wherein the decoder further comprises:
a circular shift unit to store a set of MRU amplitude values based on the identified number of occurrences of the symbol values; and
an XOR unit coupled to the interconnect and the circular shift unit as inputs and to the training unit as output.

19. The system of claim 18, wherein:
the decoder includes a zero decompressor to add compressed zero-value symbol values removed by a zero compressor.

20. The system of claim 18 wherein each symbol value is approximately at one of four amplitude values.

* * * * *